US007477202B2

(12) United States Patent
Zhu et al.

(10) Patent No.: US 7,477,202 B2
(45) **Date of Patent: *Jan. 13, 2009**

(54) MOBILE WIRELESS COMMUNICATIONS DEVICE WITH REDUCED INTERFERING RF ENERGY INTO RF METAL SHIELD SECURED ON CIRCUIT BOARD

(75) Inventors: Lizhong Zhu, Waterloo (CA); Michael Corrigan, Waterloo (CA); Robert Grant, Listowel (CA); Liviu George, Mississauga (CA); Perry Jarmuszewski, Waterloo (CA)

(73) Assignee: Research In Motion, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/857,467

(22) Filed: Sep. 19, 2007

(65) Prior Publication Data

US 2008/0007475 A1 Jan. 10, 2008

Related U.S. Application Data

(63) Continuation of application No. 11/419,770, filed on May 23, 2006, now Pat. No. 7,310,067.

(51) Int. Cl.
*H01Q 1/24* (2006.01)
*H01Q 1/52* (2006.01)

(52) U.S. Cl. ....................................... 343/702; 343/841

(58) Field of Classification Search ................. 343/702, 343/841

See application file for complete search history.

(56) References Cited

U.S. PATENT DOCUMENTS

| | | | | |
|---|---|---|---|---|
| 5,053,924 | A * | 10/1991 | Kurgan | 361/818 |
| 5,764,693 | A | 6/1998 | Taylor et al. | 375/222 |
| 6,647,367 | B2 | 11/2003 | McArthur et al. | 704/226 |
| 6,803,883 | B2 | 10/2004 | Abrams et al. | 343/841 |
| 2002/0029893 | A1 | 3/2002 | Toyoda et al. | 174/35 |
| 2004/0146452 | A1 | 7/2004 | Fujieda et al. | 423/447.2 |
| 2006/0233356 | A1 | 10/2006 | Lu et al. | 379/433.01 |

FOREIGN PATENT DOCUMENTS

| | | |
|---|---|---|
| GB | 2381956 | 5/2003 |
| JP | 2005-286191 | 10/2005 |
| WO | 01/91530 | 11/2001 |
| WO | 2004/086587 | 10/2004 |

* cited by examiner

*Primary Examiner*—Hoang V Nguyen
(74) *Attorney, Agent, or Firm*—Allen, Dyer, Doppelt, Milbrath & Gilchrist, P.A.

(57) ABSTRACT

A mobile wireless communications device includes a housing and circuit board carried by the housing and having RF circuitry comprising at least one RF component and plurality of other components mounted on the circuit board. An RF metal shield is secured to the circuit board and surrounds and isolates the at least one RF component and plurality of other components within the RF metal shield. An RF absorber is positioned adjacent an area of the RF component that radiates energy to aid in reducing energy radiated from the RF component into the RF metal shield.

16 Claims, 6 Drawing Sheets

MOBILE WIRELESS COMMUNICATIONS DEVICE WITH REDUCED INTERFERING RF ENERGY INTO RF METAL SHIELD SECURED ON CIRCUIT BOARD

Related Application

This application is a continuation of Ser. No. 11/419,770 filed on May 23, 2006, now U.S. Pat. No. 7,310,067, the disclosure of which is hereby incorporated by reference in its entirety.

FIELD OF THE INVENTION

The present invention relates to the field of communications devices, and more particularly, to mobile wireless communications devices and related methods.

BACKGROUND OF THE INVENTION

Cellular communication systems continue to grow in popularity and have become an integral part of both personal and business communications. Cellular telephones allow users to place and receive phone calls most anywhere they travel. Moreover, as cellular telephone technology is increased, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

As the functionality of cellular communications devices continues to increase, so too does demand for smaller devices that are easier and more convenient for users to carry. As any circuit boards and electronic components thereon are reduced in size and placed closer together, including antenna and microphone components, various electronic components can pick up conductive energy and create interference within the system.

Many of the designs include an RF metal shield secured onto the printed circuit board, and surrounding and isolating different RF components, including transceiver chip sets such as multi-chip modules, which are secured on the circuit board within the housing. The RF metal shield encloses these components and chip sets. Some of the RF components or chip sets radiate RF energy to other chips or components that are in close proximity from electromagnetic coupling through the RF metal shield. This type of electromagnetic coupling (EMC) or electromagnetic interference (EMI) coupling causes interference to the RF circuits, and degrades RF performance, such as receiver sensitivity. Thus, the RF metal shield that is supposed to shield the components from extraneous RF energy can in and of itself create electromagnetic coupling problems with different RF components that are supposed to be shielded within the RF shield.

BRIEF DESCRIPTION OF THE DRAWINGS

Other objects, features and advantages will become apparent from the detailed description which follows when considered in light of the accompanying drawings in which.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

A mobile wireless communications device includes a housing and circuit board carried by the housing and having RF circuitry comprising at least one RF component, and a plurality of other components mounted on the circuit board. An RF metal shield is secured to the circuit board and surrounds and isolates the at least one RF component and plurality of other components within the RF metal shield. An RF absorber is positioned adjacent an area of the RF component that radiates energy to aid in reducing any energy radiated from the RF component into the RF metal shield. As a result, the electromagnetic coupling or interference with other portions of the RF component or other components within the RF metal shield is reduced.

The RF shield, in one non-limiting example, has an opening at an area of the RF component that radiates energy. The RF absorber is formed as an RF absorbing material positioned at the opening of the RF metal shield. This RF absorbing material could be formed as a ferrite material, and preferably as a planar sheet that could be secured by adhesive tape to the RF metal shield. The RF absorber could also be formed as a longitudinal slot positioned over the area of the RF component that radiates RF energy.

In another non-limiting example, the RF component can be formed as an RF chip set and preferably as a transceiver chip set that could be formed as a transmitter chip, receiver chip and local oscillator chip. The RF absorber can be positioned adjacent the transmitter chip. The RF circuitry could also be operative for generating Global System for Mobile (GSM) communications packet bursts. The RF circuitry could also include an RF transceiver, multi-chip module and associated RF components.

A method aspect is also set forth.

Figure 1:
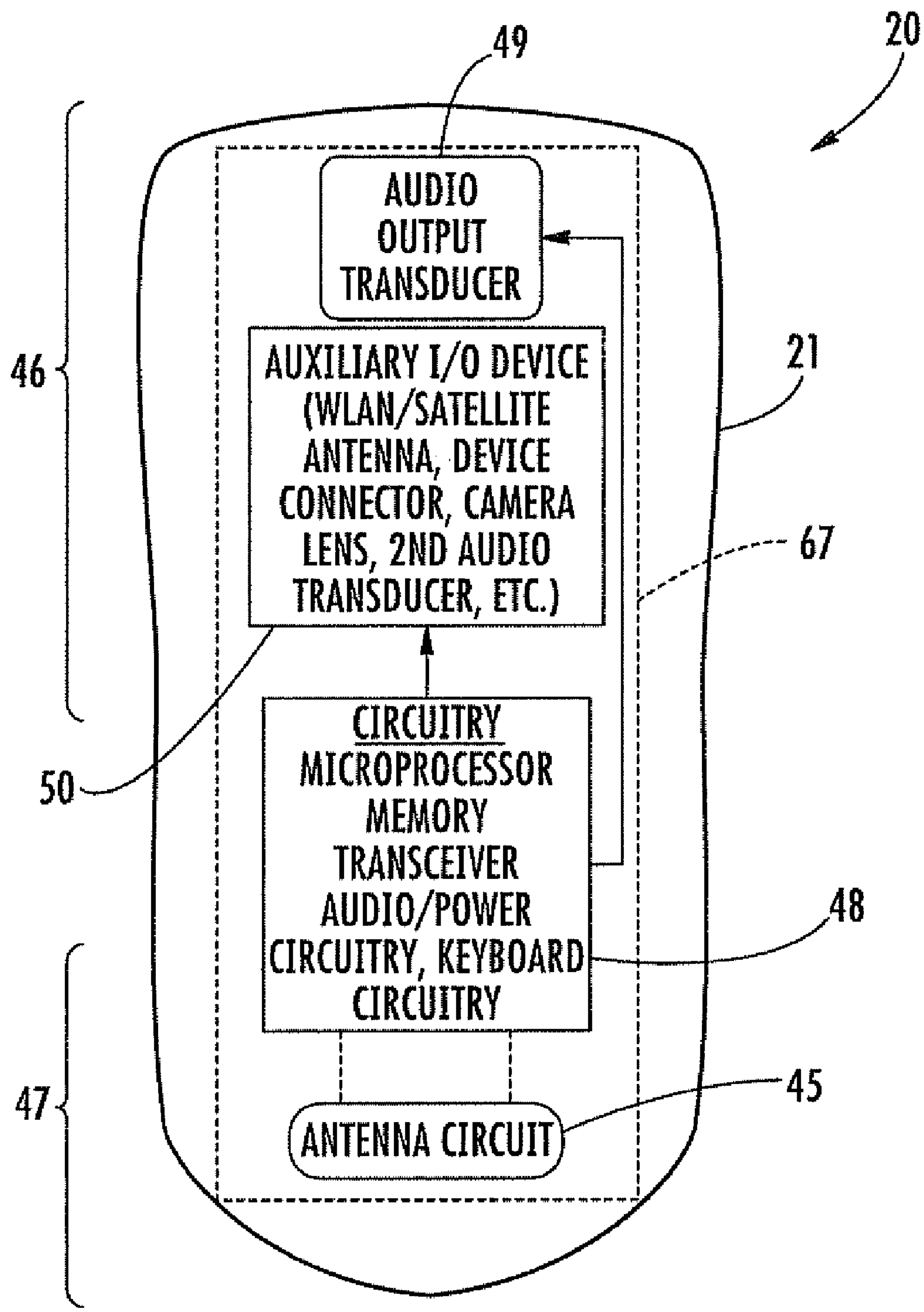
FIG. 1 is a schematic block diagram of an example of a mobile wireless communications device configured as a handheld device that can be used and illustrating basic internal components thereof.
Figure 2:
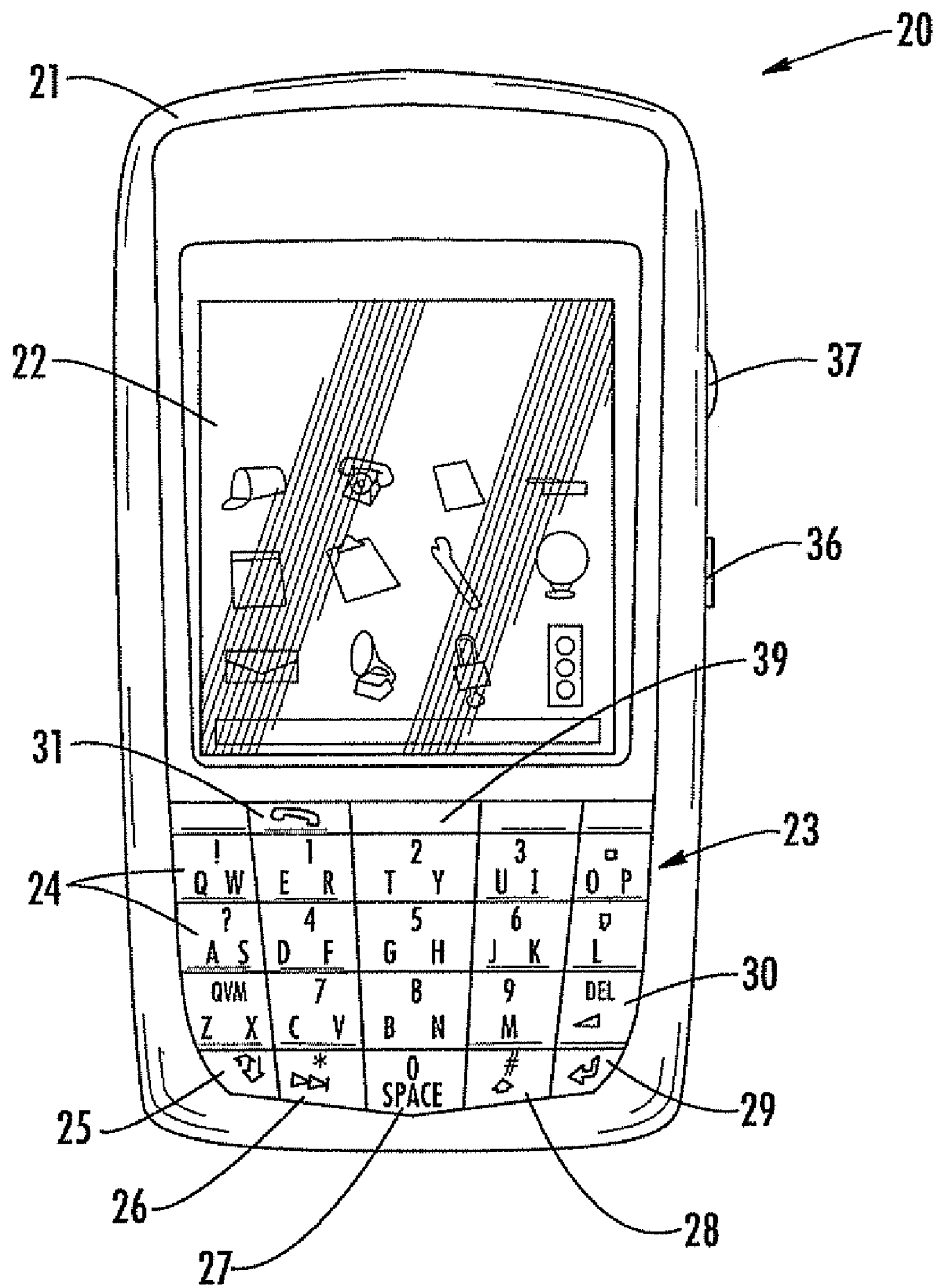
FIG. 2 is a front elevation view of the mobile wireless communications device of FIG. 1.
Figure 3:
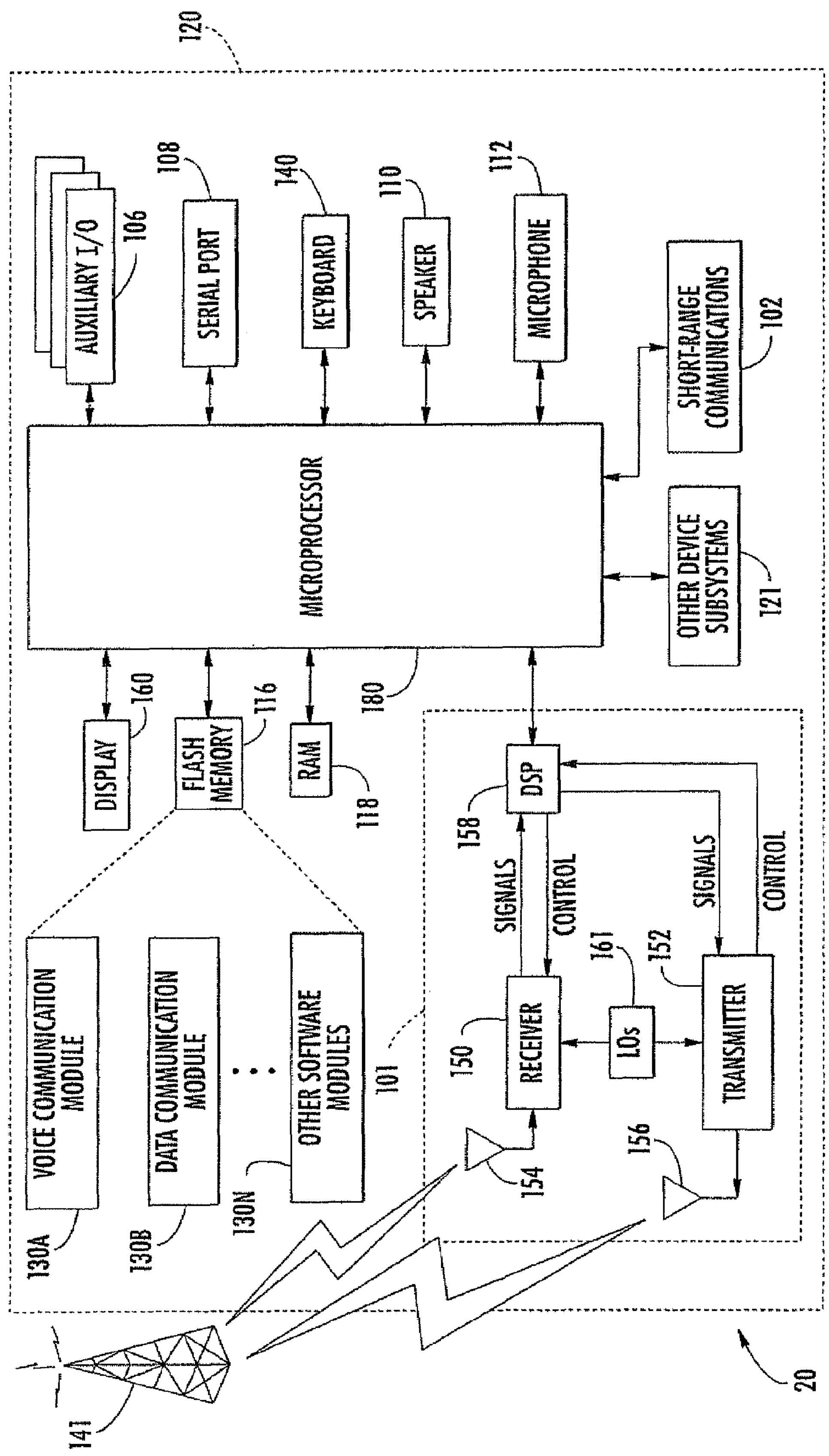
FIG. 3 is a schematic block diagram showing basic functional circuit components that can be used in the mobile wireless communications device of FIGS. 1-2.

A brief description will now proceed relative to FIGS. 1-3, which disclose an example of a mobile wireless communications device, for example, a handheld portable cellular radio, which can incorporate the non-limiting examples of the various circuits. FIGS. 1-3 are representative non-limiting examples of the many different types of functional circuit components and their interconnection.

Referring initially to FIGS. 1 and 2, an example of a mobile wireless communications device 20, such as a handheld portable cellular radio is first described. This device 20 illustratively includes a housing 21 having an upper portion 46 and a lower portion 47, and a dielectric substrate (i.e., circuit board) 67, such as a conventional printed circuit board (PCB) substrate, for example, carried by the housing. A housing cover (not shown in detail) would typically cover the front portion of the housing. The term circuit board 67 as used hereinafter can refer to any dielectric substrate, PCB, ceramic substrate or other circuit carrying structure for carrying signal circuits and electronic components within the mobile wireless communications device 20. The illustrated housing 21 is a static housing, for example, as opposed to a flip or sliding housing which are used in many cellular telephones. However, these and other housing configurations may also be used.

Circuitry 48 is carried by the circuit board 67, such as a microprocessor, memory, one or more wireless transceivers (e.g., cellular, WLAN, etc.), which includes RF circuitry, including audio and power circuitry, including any keyboard circuitry. It should be understood that keyboard circuitry could be on a separate keyboard, etc., as will be appreciated by those skilled in the art. A battery (not shown) is also preferably carried by the housing 21 for supplying power to the circuitry 48. The term RF circuitry could encompass the interoperable RF transceiver circuitry, power circuitry and audio circuitry.

Furthermore, an audio output transducer 49 (e.g., a speaker) is carried by an upper portion 46 of the housing 21 and connected to the circuitry 48. One or more user input interface devices, such as a keypad (keyboard) 23 (FIG. 2), is also preferably carried by the housing 21 and connected to the circuitry 48. The term keypad as used herein also refers to the term keyboard, indicating the user input devices having lettered and/or numbered keys commonly known and other embodiments, including multi-top or predictive entry modes. Other examples of user input interface devices include a scroll wheel 37 and a back button 36. Of course, it will be appreciated that other user input interface devices (e.g., a stylus or touch screen interface) may be used in other embodiments.

An antenna 45 is preferably positioned at the lower portion 47 in the housing and can be formed as a pattern of conductive traces that make an antenna circuit, which physically forms the antenna. It is connected to the circuitry 48 on the main circuit board 67. In one non-limiting example, the antenna could be formed on an antenna circuit board section that extends from the circuit board at the lower portion of the housing. By placing the antenna 45 adjacent the lower portion 47 of the housing 21, the distance is advantageously increased between the antenna and the user's head when the phone is in use to aid in complying with applicable SAR requirements. Also, a separate keyboard circuit board could be used.

More particularly, a user will typically hold the upper portion of the housing 21 very close to his head so that the audio output transducer 49 is directly next to his ear. Yet, the lower portion 47 of the housing 21 where an audio input transducer (i.e., microphone) is located need not be placed directly next to a user's mouth, and can be held away from the user's mouth. That is, holding the audio input transducer close to the user's mouth may not only be uncomfortable for the user, but it may also distort the user's voice in some circumstances. In addition, the placement of the antenna 45 adjacent the lower portion 47 of the housing 21 also advantageously spaces the antenna farther away from the user's brain.

Another important benefit of placing the antenna 45 adjacent the lower portion 47 of the housing 21 is that this may allow for less impact on antenna performance due to blockage by a user's hand. That is, users typically hold cellular phones toward the middle to upper portion of the phone housing, and are therefore more likely to put their hands over such an antenna than they are an antenna mounted adjacent the lower portion 47 of the housing 21. Accordingly, more reliable performance may be achieved from placing the antenna 45 adjacent the lower portion 47 of the housing 21.

Still another benefit of this configuration is that it provides more room for one or more auxiliary input/output (I/O) devices 50 to be carried at the upper portion 46 of the housing. Furthermore, by separating the antenna 45 from the auxiliary I/O device(s) 50, this may allow for reduced interference therebetween.

Some examples of auxiliary I/O devices 50 include a WLAN (e.g., Bluetooth, IEEE 802.11) antenna for providing WLAN communication capabilities, and/or a satellite positioning system (e.g., GPS, Galileo, etc.) antenna for providing position location capabilities, as will be appreciated by those skilled in the art. Other examples of auxiliary I/O devices 50 include a second audio output transducer (e.g., a speaker for speaker phone operation), and a camera lens for providing digital camera capabilities, an electrical device connector (e.g., USB, headphone, secure digital (SD) or memory card, etc.).

It should be noted that the term "input/output" as used herein for the auxiliary I/O device(s) 50 means that such devices may have input and/or output capabilities, and they need not provide both in all embodiments. That is, devices such as camera lenses may only receive an optical input, for example, while a headphone jack may only provide an audio output.

The device 20 further illustratively includes a display 22, for example, a liquid crystal display (LCD) carried by the housing 21 and connected to the circuitry 48. A back button 36 and scroll wheel 37 can also be connected to the circuitry 48 for allowing a user to navigate menus, text, etc., as will be appreciated by those skilled in the art. The scroll wheel 37 may also be referred to as a "thumb wheel" or a "track wheel" in some instances. The keypad 23 illustratively includes a plurality of multi-symbol keys 24 each having indicia of a plurality of respective symbols thereon. The keypad 23 also illustratively includes an alternate function key 25, a next key 26, a space key 27, a shift key 28, a return (or enter) key 29, and a backspace/delete key 30.

The next key 26 is also used to enter a "*" symbol upon first pressing or actuating the alternate function key 25. Similarly, the space key 27, shift key 28 and backspace key 30 are used to enter a "0" and "#", respectively, upon first actuating the alternate function key 25. The keypad 23 further illustratively includes a send key 31, an end key 32, and a convenience (i.e., menu) key 39 for use in placing cellular telephone calls, as will be appreciated by those skilled in the art.

Moreover, the symbols on each key 24 are arranged in top and bottom rows. The symbols in the bottom rows are entered when a user presses a key 24 without first pressing the alternate function key 25, while the top row symbols are entered by first pressing the alternate function key. As seen in FIG. 2, the multi-symbol keys 24 are arranged in the first three rows on the keypad 23 below the send and end keys 31, 32. Furthermore, the letter symbols on each of the keys 24 are arranged to define a QWERTY layout. That is, the letters on the keypad 23 are presented in a three-row format, with the letters of each row being in the same order and relative position as in a standard QWERTY keypad.

Each row of keys (including the fourth row of function keys 25-29) is arranged in five columns. The multi-symbol keys 24 in the second, third, and fourth columns of the first, second, and third rows have numeric indicia thereon (i.e., 1 through 9) accessible by first actuating the alternate function key 25. Coupled with the next, space, and shift keys 26, 27, 28, which respectively enter a "*", "0", and "#" upon first actuating the alternate function key 25, as noted above, this set of keys defines a standard telephone keypad layout, as would be found on a traditional touch-tone telephone, as will be appreciated by those skilled in the art.

Accordingly, the mobile wireless communications device 20 as described may advantageously be used not only as a traditional cellular phone, but it may also be conveniently used for sending and/or receiving data over a cellular or other network, such as Internet and email data, for example. Of course, other keypad configurations may also be used in other embodiments. Multi-tap or predictive entry modes may be used for typing e-mails, etc. as will be appreciated by those skilled in the art.

The antenna 45 is preferably formed as a multi-frequency band antenna, which provides enhanced transmission and reception characteristics over multiple operating frequencies. More particularly, the antenna 45 is designed to provide high gain, desired impedance matching, and meet applicable SAR requirements over a relatively wide bandwidth and multiple cellular frequency bands. By way of example, the antenna 45 preferably operates over five bands, namely a 850 MHz Global System for Mobile Communications (GSM) band, a 900 MHz GSM band, a DCS band, a PCS band, and a WCDMA band (i.e., up to about 2100 MHz), although it may be used for other bands/frequencies as well. To conserve space, the antenna 45 may advantageously be implemented in three dimensions although it may be implemented in two-dimensional or planar embodiments as well.

The mobile wireless communications device shown in FIGS. 1 and 2 can incorporate e-mail and messaging accounts and provide different functions such as composing e-mail, PIN messages, and SMS messages. The device can manage messages through an appropriate menu that can be retrieved by choosing a messages icon. An address book function could add contacts, allow management of an address book, set address book options and manage SIM card phone books. A phone menu could allow for the making and answering of phone calls using different phone features, managing phone call logs, setting phone options, and viewing phone information. A browser application could permit the browsing of web pages, configuring a browser, adding bookmarks, and changing browser options. Other applications could include a task, memo pad, calculator, alarm and games, as well as handheld options with various references.

A calendar icon can be chosen for entering a calendar program that can be used for establishing and managing events such as meetings or appointments. The calendar program could be any type of messaging or appointment/meeting program that allows an organizer to establish an event, for example, an appointment or meeting.

A non-limiting example of various functional components that can be used in the exemplary mobile wireless communications device 20 of FIGS. 1 and 2 is further described in the example below with reference to FIG. 3. The device 20 illustratively includes a housing 120, a keypad 140 and an output device 160. The output device 160 shown is preferably a display, which is preferably a full graphic LCD. Other types of output devices may alternatively be used. A processing device 180 is contained within the housing 120 and is coupled between the keypad 140 and the display 160. The processing device 180 controls the operation of the display 160, as well as the overall operation of the mobile device 20, in response to actuation of keys on the keypad 140 by the user.

The housing 120 may be elongated vertically, or may take on other sizes and shapes (including clamshell housing structures). The keypad may include a mode selection key, or other hardware or software for switching between text entry and telephony entry.

In addition to the processing device 180, other parts of the mobile device 20 are shown schematically in FIG. 3. These include a communications subsystem 101; a short-range communications subsystem 102; the keypad 140 and the display 160, along with other input/output devices 106, 108, 110 and 112; as well as memory devices 116, 118 and various other device subsystems 121. The mobile device 20 is preferably a two-way RF communications device having voice and data communications capabilities. In addition, the mobile device 20 preferably has the capability to communicate with other computer systems via the Internet.

Operating system software executed by the processing device 180 is preferably stored in a persistent store, such as the flash memory 116, but may be stored in other types of memory devices, such as a read only memory (ROM) or similar storage element. In addition, system software, specific device applications, or parts thereof, may be temporarily loaded into a volatile store, such as the random access memory (RAM) 118. Communications signals received by the mobile device may also be stored in the RAM 118.

The processing device 180, in addition to its operating system functions, enables execution of software applications 130A-130N on the device 20. A predetermined set of applications that control basic device operations, such as data and voice communications 130A and 130B, may be installed on the device 20 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 141. Preferably, the PIM data items are seamlessly integrated, synchronized and updated via the wireless network 141 with the device user's corresponding data items stored or associated with a host computer system.

Communication functions, including data and voice communications, are performed through the communications subsystem 101, and possibly through the short-range communications subsystem. The communications subsystem 101 includes a receiver 150, a transmitter 152, and one or more antennae 154 and 156. In addition, the communications subsystem 101 also includes a processing module, such as a digital signal processor (DSP) 158, and local oscillators (LOs) 161. The specific design and implementation of the communications subsystem 101 is dependent upon the communications network in which the mobile device 20 is intended to operate. For example, the mobile device 20 may include a communications subsystem 101 designed to operate with the Mobitex™, Data TAC™ or General Packet Radio Service (GPRS) mobile data communications networks, and also designed to operate with any of a variety of voice communications networks, such as AMPS, TDMA, CDMA, PCS, GSM, etc. Other types of data and voice networks, both separate and integrated, may also be utilized with the mobile device 20.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card, in order to operate on a GPRS network.

When required network registration or activation procedures have been completed, the mobile device 20 may send and receive communications signals over the communication network 141, Signals received from the communications network 141 by the antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communications functions, such as demodulation and decoding. In a similar manner, signals to be transmitted to the network 141 are processed (e.g., modulated and encoded) by the DSP 158 and are then provided to the transmitter 152 for digital to analog conversion, frequency up conversion, filtering, amplification and transmission to the communication network 141 (or networks) via the antenna 156.

In addition to processing communications signals, the DSP 158 provides for control of the receiver 150 and the transmitter 152. For example, gains applied to communications signals in the receiver 150 and transmitter 152 may be adaptively controlled through automatic gain control algorithms implemented in the DSP 158.

In a data communications mode, a received signal, such as a text message or web page download, is processed by the communications subsystem 101 and is input to the processing device 180. The received signal is then further processed by the processing device 180 for an output to the display 160, or alternatively to some other auxiliary I/O device 106. A device user may also compose data items, such as e-mail messages, using the keypad 140 and/or some other auxiliary I/O device 106, such as a touchpad, a rocker switch, a thumb-wheel, or some other type of input device. The composed data items may then be transmitted over the communications network 141 via the communications subsystem 101.

In a voice communications mode, overall operation of the device is substantially similar to the data communications mode, except that received signals are output to a speaker 110, and signals for transmission are generated by a microphone 112. Alternative voice or audio I/O subsystems, such as a voice message recording subsystem, may also be implemented on the device 20. In addition, the display 160 may also be utilized in voice communications mode, for example to display the identity of a calling party, the duration of a voice call, or other voice call related information.

Any short-range communications subsystem enables communication between the mobile device 20 and other proximate systems or devices, which need not necessarily be similar devices. For example, the short-range communications subsystem may include an infrared device and associated circuits and components, or a Bluetooth™ communications module to provide for communication with similarly-enabled systems and devices.

Figure 4:
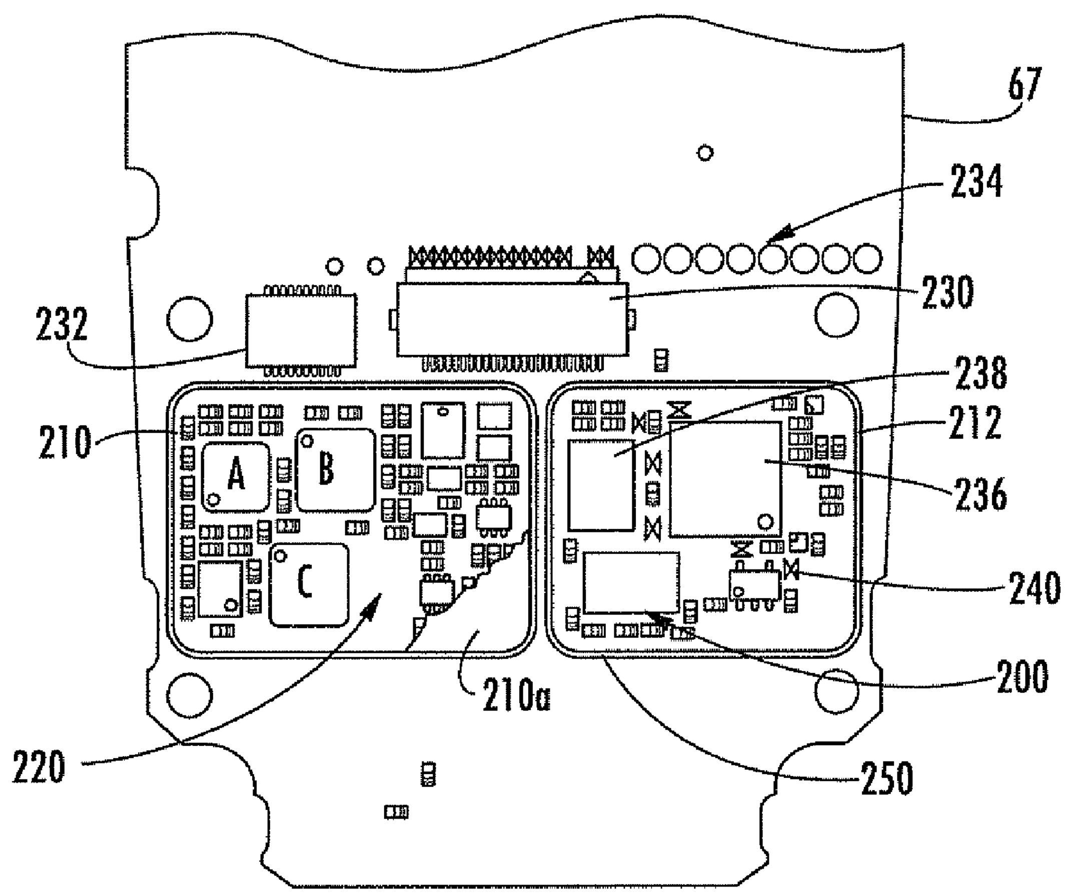
FIG. 4 is front elevational view of the mobile wireless communications device having the front cover removed to illustrate an example of RF circuitry, power amplifier, surface mounted microphone and noise isolation components associated thereof.

FIG. 4 is an example of a circuit layout on part of the circuit board 67 that can be included within the mobile wireless communications device 20 of FIGS. 1-3, and showing a front cover removed from a housing to illustrate a surface mounted microphone 200 and its circuitry and associated noise isolation components as will be explained in greater detail below. The circuit board 67 includes radio frequency (RF) circuitry, for example, cellular telephone communications circuitry, which is mounted in first and second isolation RF metal shields or "cans" 210,212, as often called by those skilled in the art, forming a compartment on the circuit board, each which receive the RF circuitry and other components, which typically are RF components. Each can 210,212 forms a radio frequency isolation compartment and typically includes sides and a top, such as a portion of the top 210*a* shown remaining on can 210. The first can 210 includes a transceiver chip set 220, for example, a transmitter chip, receiver chip, and local oscillator chip as non-limiting examples with those chips labeled A, B and C. The chip set could, in non-limiting examples, be formed as an RF transceiver multi-chip module. Other illustrated components could include the various resistors, capacitors, amplifiers, regulators and other circuit components common to those devices, but not explained in detail.

Located outside first and second isolation cans 210,212, but mounted on the circuit board 67, is a liquid crystal display (LCD) connector 230 and a keyboard connector 232, as well as associated circuit components 234. These components 230, 232 and 234 can be configured in different configurations besides the configuration illustrated in the non-limiting example of FIG. 4. The compartment within the second isolation can 212 includes a power amplifier 236 and switch diplexer 238. Other components 240 are mounted within the compartment and form the resistors, capacitors, transistors, and inductors necessary to drive the audio and power circuits for the microphone, power amplifier and other circuits.

To provide microphone isolation, a radio frequency isolation shield 250, formed in the illustrated non-limiting example as a third isolation "can" 250, is positioned at a corner of the second "can" 212, and forms another isolation compartment at this corner. The shield is formed as a separate metallic housing secured to the circuit board and surrounding the microphone, effectively covering, i.e., shielding the entire microphone. Although a "can" configuration formed as a metallic housing with top and sides and is used for the RF shield, other configurations could be used. The compartment formed by the isolation shield 250 receives a microphone 200 formed preferably as a surface mounted microphone integrated circuit chip 200 on the circuit board 67. As illustrated in this non-limiting configuration, this places the microphone chip adjacent to the bottom center of the device 20 where the sound hole is typically located in the cover of a cellular phone or similar mobile wireless communications device.

To reduce noise resulting from RF circuitry, the metal RF shield or "can" forming an isolation shield includes a side and top metal wall, i.e., forming a complete isolation shield surrounding or covering the microphone 200 and its associated circuitry to provide isolation from the RF circuitry. This isolation shield provides the necessary isolation from the RF amplifiers and from any energy radiated from the antenna.

Figure 5:
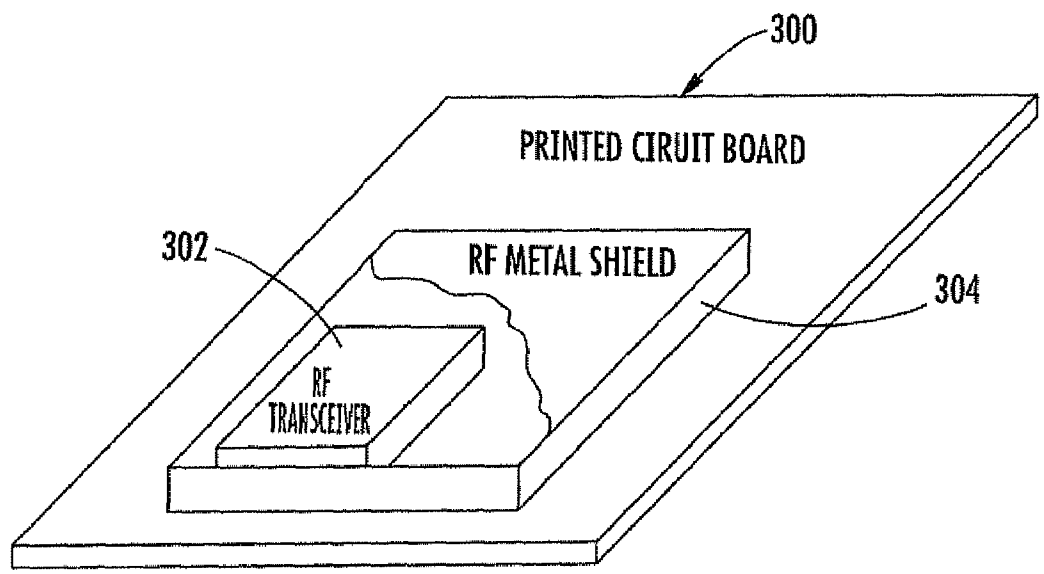
FIG. 5 is a fragmentary, isometric drawing of a prior art RF metal shield covering an RF transceiver on a printed circuit board.

Referring now to FIG. 5, a circuit board 300, such as the type explained relative to FIGS. 1-4, is shown and includes an RF transceiver 302 mounted thereon, which could correspond to an RF transceiver multi-chip module as explained before, and having transmitter, receiver and local oscillator chips as explained before. The RF transceiver 302 is covered by an RF metal shield 304 as explained before. In this prior art example, the entire RF transceiver 302 is covered by the RF metal shield. In some instances, the RF energy from one portion of the RF transceiver or other RF component is generated into the RF metal shield and cause electromagnetic coupling or interference with certain sections of the RF transceiver or other RF components within the RF metal shield.

Figure 6:
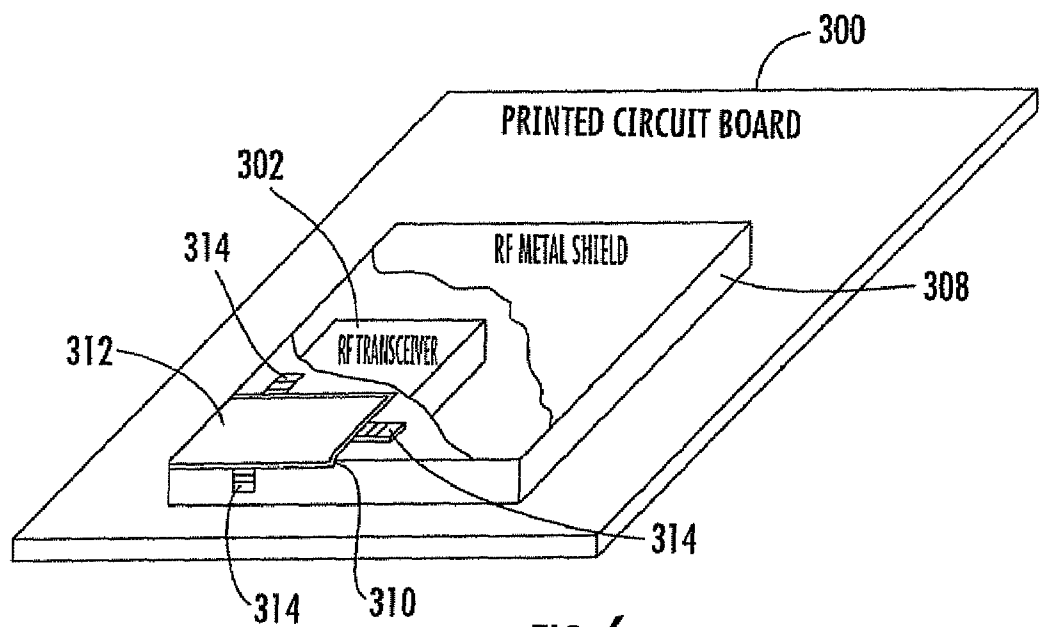
FIG. 6 is a fragmentary, isometric drawing of an RF metal shield that includes an RF absorber formed as absorbing material positioned at an opening of the RF metal shield to aid in reducing RF energy radiated from an RF component such as part of an RF transceiver chip set into the RF metal shield and causing electromagnetic coupling or electromagnetic interference with other portions of the RF components or chip set within the RF metal shield.
Figure 7:
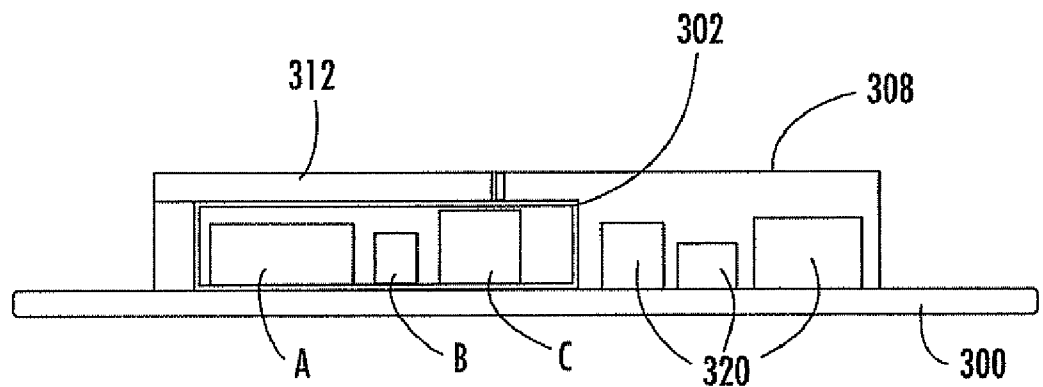
FIG. 7 is a fragmentary side elevation drawing of the RF metal shield and RF absorbing material positioned at an opening within the RF metal shield and covering a portion of an RF transceiver multi-chip module.

In accordance with one non-limiting example, the RF metal shield 308 shown in FIG. 6 has been modified to include an opening 310 positioned at that area or section of the RF transceiver or other RF component that radiates RF energy. An RF absorber 312 is formed as an RF absorbing material in this illustrated embodiment and positioned at the opening, i.e., adjacent that area of the RF component, such as the transceiver or chip that radiates RF energy, to aid in reducing RF energy radiated from the component into the RF metal shield and causing electromagnetic coupling or interference with other portions of the RF component or chip within the RF metal shield. This RF absorbing material 312 in the illustrated embodiment is formed as a ferrite material, preferably formed and as a planar sheet. Adhesive tape 314 can secure the RF absorbing material 312 to the RF metal shield. Of course, the RF transceiver is shown as one unit, such as an RF transceiver/multi-chip module, but it could include the basic transmitter chip, receiver chip and local oscillator chips labeled A, B and C as shown in FIG. 7, which are shown positioned in a multi-chip module and adjacent other RF and perhaps non-RF components 320 that are within the confines of the RF metal shield.

The RF absorbing material can be formed of different ferrite materials and typically has an applicable frequency of about 0.1 to about 3.0 GHz. An example of such RF absorbing material is the microwave absorbing material sold under the designation EA20/EA21 by Murata Manufacturing Company, Ltd. The thickness in non-limiting examples can range from about 0.05 millimeters to about 3.00 millimeters. The structure can be halogen free and have a flame resistance and operating temperature range from about −40 to about +120° C. Adhesive tape can be used to secure the material to an object, for example, the RF metal shield in this example. The material can be formed from an Ni—Zn ferrite material in one non-limiting example, and can have a specific gravity of about 3.4 (Typ) and a tensile strength of 3.0 MPa (min) and a surface resistance of about $1.0\times10^{11}$ (min), in non-limiting examples. Flame resistance can be compatible to UL94V-O.

Figure 8:
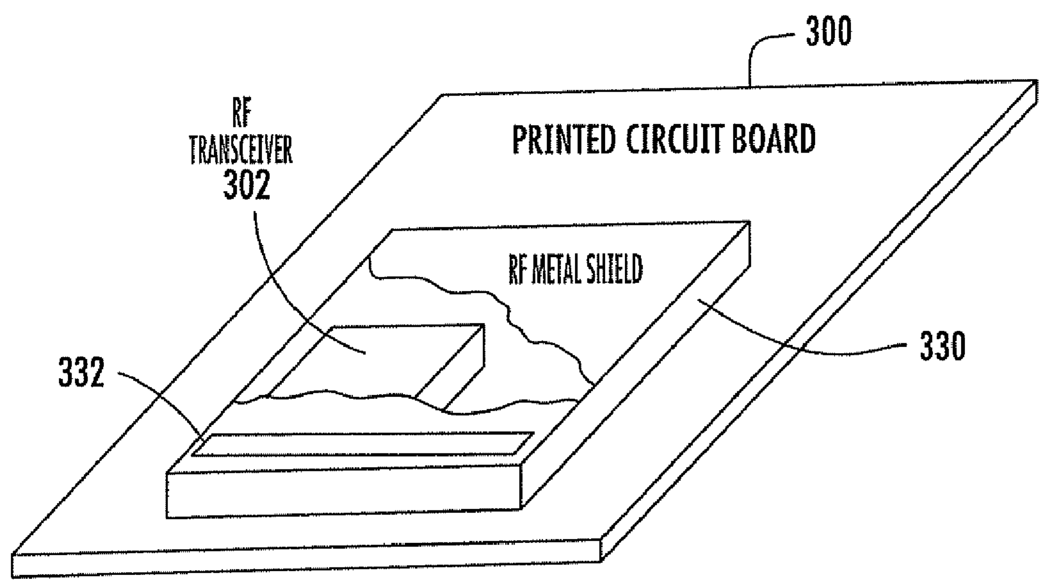
FIG. 8 is another embodiment showing the RF metal shield and the RF absorber formed as a long and narrow slot on the RF metal shield to reduce RF coupling.

FIG. 8 shows another RF metal shield 330 in which the RF absorber is formed as a longitudinally extending, but narrow slot 332 that is on the metal shield and positioned over that portion of the RF component that emits the RF radiation to prevent RF coupling as described before. In this specific instance, the longitudinal slot is operable to break-up the RF energy from coupling into the metal shield and onto other components, thus reducing the undesirable electromagnetic interference and electromagnetic coupling.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A mobile wireless communications device, comprising:

a housing;

RF circuitry mounted within the housing and comprising at least one RF component and plurality of other components;

an RF metal shield surrounding and isolating said at least one RF component and plurality of other components within said RF metal shield, said RF metal shield having an RF absorber formed as an opening within the RF shield and positioned adjacent an area of the RF component that radiates energy, wherein said opening is configured to aid in reducing energy radiated from the RF component into the RF metal shield and causing electromagnetic coupling or interference with other portions of said RF component or other components within said RF metal shield.

2. A mobile wireless communications device according to claim 1, wherein said RF absorber further comprises an RF absorbing material positioned at the opening of the RF metal shield.

3. A mobile wireless communications device according to claim 2, wherein said RF absorbing material comprises a ferrite material.

4. A mobile wireless communications device according to claim 3, wherein said RF absorbing material comprises a planar sheet.

5. A mobile wireless communications device according to claim 4, and further comprising an adhesive tape securing to said RF metal shield said planar sheet that forms said RF absorbing material.

6. A mobile wireless communications device according to claim 1, wherein said RF absorber as an opening is formed as a longitudinal slot positioned over the area of the RF component that radiates energy.

7. A mobile wireless communications device according to claim 1, wherein said at least one RF component comprises an RF chip set.

8. A mobile wireless communications device according to claim 7, wherein said RF chip set comprises a transceiver chip set.

9. A mobile wireless communications device according to claim 8, wherein said chip set comprises a transmitter chip, receiver chip and local oscillator chip.

10. A mobile wireless communications device according to claim 9, wherein said RF absorber is positioned adjacent said transmitter chip.

11. A mobile wireless communications device according to claim 1, wherein said RF circuitry is operative for generating Global System for Mobile (GSM) communications packet bursts.

12. A method for making a mobile wireless communications device, which comprises:

providing a housing, radio frequency (RF) circuitry including at least one RF component and other components mounted within the housing and a RF metal shield surrounding and isolating said at least one RF component and other components within said RF metal shield; and reducing energy radiated from a portion of an RF component into the RF metal shield to reduce the electromagnetic coupling or interference with other portions of said RF component or other components enclosed by said RF metal shield by positioning an RF absorber formed as an opening adjacent the area of the RF component that radiates energy and configured to reduce the electromagnetic coupling or interference.

13. A method according to claim 12, which further comprises forming the at least one RF component as an RF chip set.

14. A method according to claim 12, which further comprises forming a longitudinal slot within the RF metal shield over the portion of the at least one RF component that radiates energy.

15. A method according to claim 12, which further comprises positioning an RF absorbing material at the opening.

16. A method according to claim 15, which further comprises forming the RF absorbing material as a ferrite material.

* * * * *